(12) United States Patent
Arai

(10) Patent No.: US 9,980,419 B2
(45) Date of Patent: May 22, 2018

(54) PRESSURE CONTROL DEVICE, SURFACE MOUNT MACHINE AND PRESSURE CONTROL METHOD

(71) Applicant: YAMAHA HATSUDOKI KABUSHIKI KAISHA, Shizuoka-ken (JP)

(72) Inventor: Tomoyasu Arai, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 224 days.

(21) Appl. No.: 14/888,572

(22) PCT Filed: Jun. 28, 2013

(86) PCT No.: PCT/JP2013/067846
§ 371 (c)(1),
(2) Date: Nov. 2, 2015

(87) PCT Pub. No.: WO2014/207907
PCT Pub. Date: Dec. 31, 2014

(65) Prior Publication Data
US 2016/0066484 A1    Mar. 3, 2016

(51) Int. Cl.
*H05K 13/04* (2006.01)
*F16K 11/02* (2006.01)
(Continued)

(52) U.S. Cl.
CPC .......... *H05K 13/0408* (2013.01); *F16K 11/02* (2013.01); *G05D 16/04* (2013.01); *G05D 16/2053* (2013.01)

(58) Field of Classification Search
CPC .... B65G 47/843; B65G 47/848; H05K 13/02; H05K 13/04; H05K 13/0408; F16K 11/02; G05D 16/04; G05D 16/2053
See application file for complete search history.

(56) References Cited

FOREIGN PATENT DOCUMENTS

| CN | 1777357 A | 5/2006 |
|---|---|---|
| CN | 103037678 A | 4/2013 |

(Continued)

OTHER PUBLICATIONS

A Notice of Allowance; "Decision of Grant a Patent" and "Memorandum of Decision to Grant," issued by the Japanese Patent Office dated Jul. 19, 2016, which corresponds to Japanese Patent Application No. 2015-523789 and is related to U.S. Appl. No. 14/888,572; with English language translation.

(Continued)

*Primary Examiner* — Carl Arbes
(74) *Attorney, Agent, or Firm* — Studebaker & Brackett PC

(57) ABSTRACT

The pressure of a gas supplied to a nozzle is stably controlled over a wide range. A first positive pressure supply pathway supplies the gas at a first positive pressure. A second positive pressure supply pathway supplies the gas at a second positive pressure that is lower than the first positive pressure. A nozzle connecting pathway is connected to the nozzle. A switch-over valve selectively switches between a first connected state in which the first positive pressure supply pathway is connected to the nozzle connecting pathway and a second connected state in which the second positive pressure supply pathway is connected to the nozzle connecting pathway. A valve controller controls the connected state of the switch-over valve and adjusts the pressure of the gas supplied to the nozzle within the range from the first positive pressure to the second positive pressure.

7 Claims, 5 Drawing Sheets

(51) Int. Cl.
*G05D 16/04* (2006.01)
*G05D 16/20* (2006.01)

(56) References Cited

FOREIGN PATENT DOCUMENTS

| JP | S49-128178 A | 12/1974 |
| JP | S53-098523 A | 8/1978 |
| JP | H07-036551 A | 2/1995 |
| JP | H11-015536 A | 1/1999 |
| JP | 2003-224397 A | 8/2003 |
| JP | 2006-147719 A | 6/2006 |
| JP | 2006-147884 A | 6/2006 |
| JP | 2006-286770 A | 10/2006 |
| JP | 2008-027986 A | 2/2008 |
| JP | 2008-226978 A | 9/2008 |
| JP | 2009188052 A * | 8/2009 |
| JP | 4346770 B2 | 10/2009 |
| JP | 2011-071291 A | 4/2011 |
| JP | 4800135 B2 | 10/2011 |
| JP | 5054245 B2 * | 10/2012 |

OTHER PUBLICATIONS

The First Office Action issued by the Chinese Patent Office dated Dec. 26, 2016, which corresponds to Chinese Patent Application No. 201380074049.5 and is related to U.S. Appl. No. 14/888,572.
An Notice of Allowance issued by the Japanese Patent Office dated Jul. 19, 2016, which corresponds to Japanese Patent Application No. 2015-523789 and is related to U.S. Appl. No. 14/888,572.
International Search Report issued in PCT/JP2013/067846, dated Aug. 6, 2013.
Written Opinion issued in PCT/JP2013/067846, dated Aug. 6, 2013.

* cited by examiner

PRESSURE CONTROL DEVICE, SURFACE MOUNT MACHINE AND PRESSURE CONTROL METHOD

CROSS REFERENCE TO RELATED APPLICATIONS

This application claims benefit of priority to International Patent Application No. PCT/JP2013/067846 filed on Jun. 28, 2013, the entire content of which is incorporated herein by reference.

TECHNICAL FIELD

The disclosure is related to a pressure control technique to control the pressure of a gas supplied to a nozzle in a processing machine which ejects the gas from the nozzle toward a member-to-be-processed and accordingly performs predetermined processing of the member-to-be-processed.

BACKGROUND

Within a system to mount parts to a substrate, a substrate loading machine, a printing machine, a surface mount machine, an inspection machine, a substrate unloading machine and the like are arranged next to each other from the upstream side toward the downstream side of a substrate transportation direction along a transportation line for transporting substrates. Among these line machines, the printing machine, the surface mount machine and the inspection machine execute predetermined processing while ejecting air of a positive pressure from nozzles. The surface mount machine according to Japanese Patent Application No. 2008-27986 (FIG. 1) for instance is equipped with two types of air circuits which supply air of a positive pressure to a suction nozzle. One of them is to generate air of a suction nozzle releasing positive pressure, while the other one is to generate air of a weaker positive pressure (hereinafter "weak positive pressure") than the suction nozzle releasing positive pressure. Air of the weak positive pressure is applied to the suction nozzle to prevent fine dust and the like from adhering to a nozzle tip before the suction nozzles sucks a part. Even after suction of a part by the suction nozzle, air of the weak positive pressure is applied to the suction nozzle, thereby realizing a function of smoothly releasing the part from the suction nozzle. Meanwhile, at the time of exchanging the suction nozzle, air of a suction nozzle releasing positive pressure is applied to the suction nozzle and the suction nozzle is smoothly released.

SUMMARY

Technical Problem

Each air circuit, owing to a throttle valve, fixes the pressure of air supplied to the suction nozzle. Hence, a positive pressure which can be supplied to the suction nozzle is fixed to the two types, namely, the suction nozzle releasing positive pressure and the weak positive pressure. Therefore, in order to supply a positive pressure which is different from these positive pressures to the suction nozzle for another purpose, an additional air circuit is necessary. For the purpose of cleaning with air ejected from the suction nozzle toward a pre-suction part as in the case of Japanese Patent Application No. 2011-71291 (FIG. 5) for instance, an air circuit which develops a part cleaning positive pressure needs be separately disposed to the machine according to Japanese Patent Application No. 2008-27986 (FIG. 1).

Further, although Japanese Patent Application No. 2008-27986 (FIG. 1) describes a technique to control a positive pressure of air supplied to a suction nozzle by combining a pressure sensor with an electric-control reducing valve for the purpose of suppressing the number of air circuits for positive pressure, adoption of this gives rise to the following problems. That is, since a more expensive part than the air circuits above is used, an increase of the machine cost is inevitable. In addition, the operation time of the electric-control reducing valve is very short, it is necessary to strictly control it. For this reason, use of the electric-control reducing valve could cause a deterioration of the stability of pressure control, the time period for applying a positive pressure to the suction nozzle may be shorter or longer than an appropriate period of time. This may lead to the following problem. In short, when a part sucked by the suction nozzle is to be mounted to a substrate for example, if the period of time of applying a positive pressure to the suction nozzle which is at a negative pressure is even slightly shorter than a proper period of time, the negative pressure may remain at the suction nozzle and the suction nozzle could return back with the part. On the contrary, if the period of time of applying the positive pressure is too long, the position or the angle for mounting a part may deviate or a part which has been already mounted could be blown away.

The present disclosure has been made in light of the problems above, and accordingly, aims at providing a pressure control device and a pressure control method which make it possible to stably control the pressure of a gas supplied to a nozzle over a wide range and providing a surface mount machine which is equipped with such a pressure control device.

Solution to Problem

A pressure control device and a pressure control method according to the present disclosure controls a pressure of a gas supplied to a nozzle in a processing machine that performs predetermined processing upon a member-to-be-processed while ejecting the gas from the nozzle toward the member-to-be-processed. The pressure control device is characterized in comprising: a first positive pressure supply pathway to supply the gas at a first positive pressure; a second positive pressure supply pathway to supply the gas at a second positive pressure that is lower than the first positive pressure; a nozzle connecting pathway that is connected to the nozzle; a switch-over valve that selectively switches between a first connected state in which the first positive pressure supply pathway is connected to the nozzle connecting pathway and a second connected state in which the second positive pressure supply pathway is connected to the nozzle connecting pathway; and a valve controller that controls the connected state of the switch-over valve and adjusts the pressure of the gas supplied to the nozzle within the range from the first positive pressure to the second positive pressure. The pressure control method is characterized in comprising steps of: preparing the gas that has the first positive pressure; preparing the gas that has the second positive pressure lower than the first positive pressure; and controlling selective switching of supplying of the gas to the nozzle at the first positive pressure and supplying of the gas to the nozzle at the second positive pressure, and controlling the pressure of the gas supplied to the nozzle within the range from the first positive pressure to the second positive pressure.

According to the disclosure having the structure above, the gases of the first positive pressure and the second positive pressure are prepared and can be selectively supplied to the nozzle. This makes it possible to supply the gas to the nozzle at the first positive pressure and supply the gas to the nozzle at the second pressure. Further, switching between the selective supplying to the nozzle between the first positive pressure and the second positive pressure realizes supplying of the gas at an intermediate pressure (hereinafter "intermediate pressure") between these two positive pressures to the nozzle. The pressure of the gas that is supplied to the nozzle can thus be controlled within the range from the first positive pressure to the second positive pressure.

While the pressure control machine above is generally applicable to a processing machine that ejects a gas from a nozzle to a member-to-be-processed and accordingly performs a predetermined processing of the member-to-be-processed, the following structure is preferable for application to a surface mount machine.

A surface mount machine according to the present disclosure is a processing machine that ejects a gas from a nozzle to a part after stopping the supplying of a negative pressure to the nozzle sucking the part and mounts from a nozzle to a substrate, and comprises: a first positive pressure supply pathway to supply the gas at a first positive pressure; a second positive pressure supply pathway to supply the gas at a second positive pressure that is lower than the first positive pressure; a nozzle connecting pathway that is connected to the nozzle; a switch-over valve that selectively switches between a first connected state in which the first positive pressure supply pathway is connected to the nozzle connecting pathway and a second connected state in which the second positive pressure supply pathway is connected to the nozzle connecting pathway; and a controller that controls the connected state of the switch-over valve.

In a first aspect of the surface mount machine according to the present disclosure, the controller executes: a high pressure mode in which the first connected state is continued and the gas is supplied to the nozzle at the first positive pressure when cleaning the nozzle that does not suck the part; a low pressure mode in which the second connected state is continued after stopping supplying of the negative pressure to the nozzle and the gas is supplied to the nozzle at the second positive pressure when mounting the part to the substrate from the nozzle; and an intermediate pressure mode in which the connected state of the switch-over valve is switched multiple times after stopping supplying of the negative pressure to the nozzle, and the gas is supplied to the nozzle at the third positive pressure that is lower than the first positive pressure and is higher than the second positive pressure to remove the defective part from the nozzle when the part sucked by the nozzle is a defective part. According to the first aspect of the surface mount machine having such a structure, since the nozzle is cleaned at the relatively high positive pressure (first positive pressure), it is possible to eliminate clogging of the nozzle, etc. Further, since it is possible to mount a part at the relatively low positive pressure (second positive pressure), it is possible to mount the part at a desired position at a desired angle and effectively prevent parts that have already been mounted around this part from getting blown away. In addition, as it is possible to remove a defective part from the nozzle, i.e., discard the part at the positive pressure (third positive pressure) that is proper for discarding the defective part, it is possible to smoothly discard a defective component.

In a second aspect of the surface mount machine according to the present disclosure, the controller executes: a high pressure mode in which the first connected state is continued and the gas is supplied to the nozzle at the first positive pressure when cleaning of the nozzle that does not suck the part; a low pressure mode in which the second connected state is continued after stopping supplying of the negative pressure to the nozzle, and the gas is supplied to the nozzle at the second positive pressure when mounting the part to the substrate from the nozzle; and an intermediate pressure mode in which the connected state of the switch-over valve is switched multiple times and the gas is supplied to the nozzle at a third positive pressure that is lower than the first positive pressure and is higher than the second positive pressure when cleaning a part yet to be mounted to the substrate or cleaning the substrate using the gas. According also to the second aspect of the surface mount machine having such a structure, as in the first aspect, the nozzle is cleaned and parts are mounted respectively at the appropriate positive pressures, and therefore, it is possible to properly clean the nozzle and mount parts. Further, when cleaning of a part which has not been mounted to the substrate or cleaning of the substrate, gases are supplied to the nozzle at the proper positive pressure (third positive pressure), and therefore, it is possible to appropriately clean the part which has not been mounted yet, the substrate, etc.

Advantageous Effect of the Disclosure

As described above, according to the disclosure, since the structure allows to selectively supply the two types of gases (the first positive pressure and the second positive pressure), it is possible to supply the gas to the nozzle at the first positive pressure, the gas to the nozzle at the second positive pressure and the gas to the nozzle at the intermediate pressure. This realizes stable control of the pressure of the gas supplied to the nozzle within the wide range from the first positive pressure to the second positive pressure.

DETAILED DESCRIPTION

Figure 1:
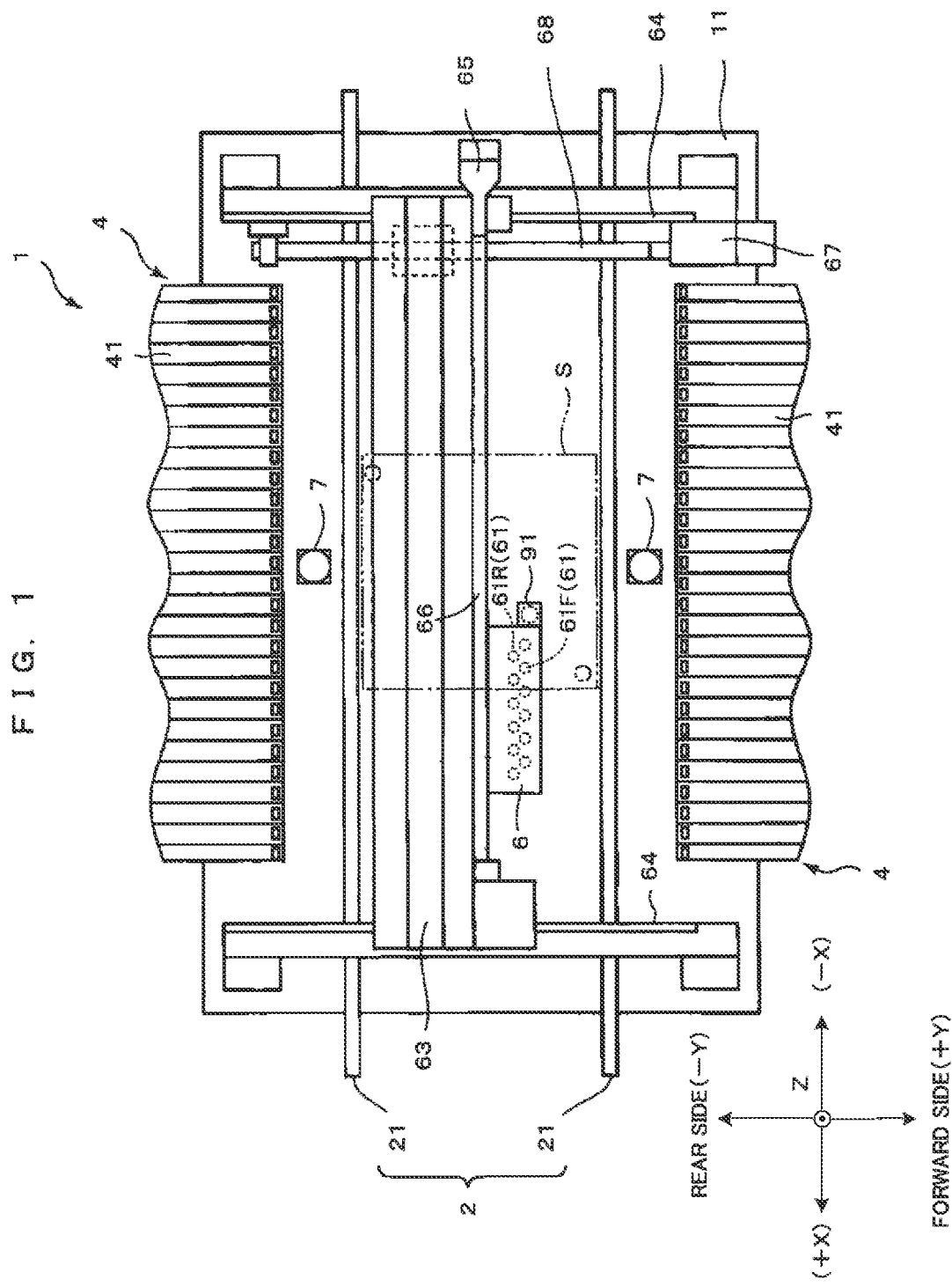
FIG. 1 is a plan view showing a schematic structure of a surface mount machine which is equipped with a pressure control device according to an embodiment of the disclosure.
Figure 2:
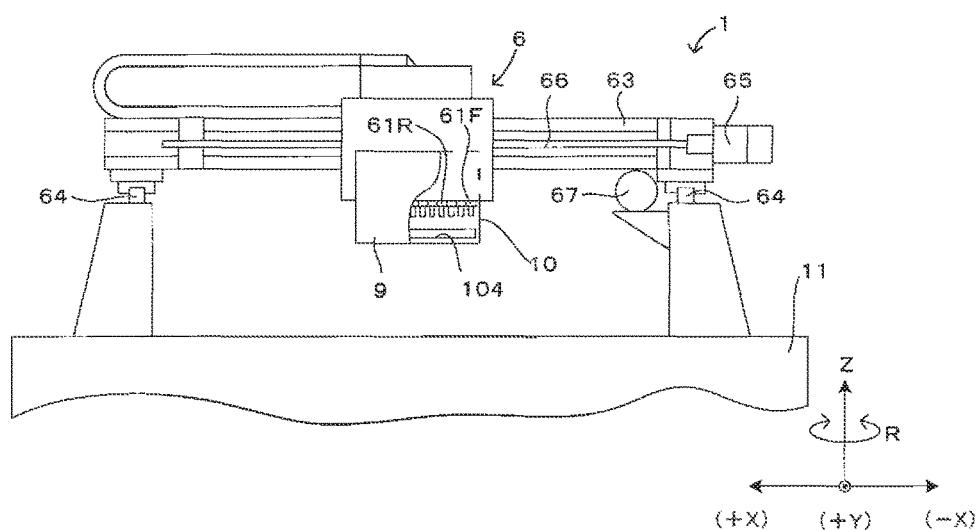
FIG. 2 is a partial front view of the surface mount machine shown in FIG. 1.
Figure 3:
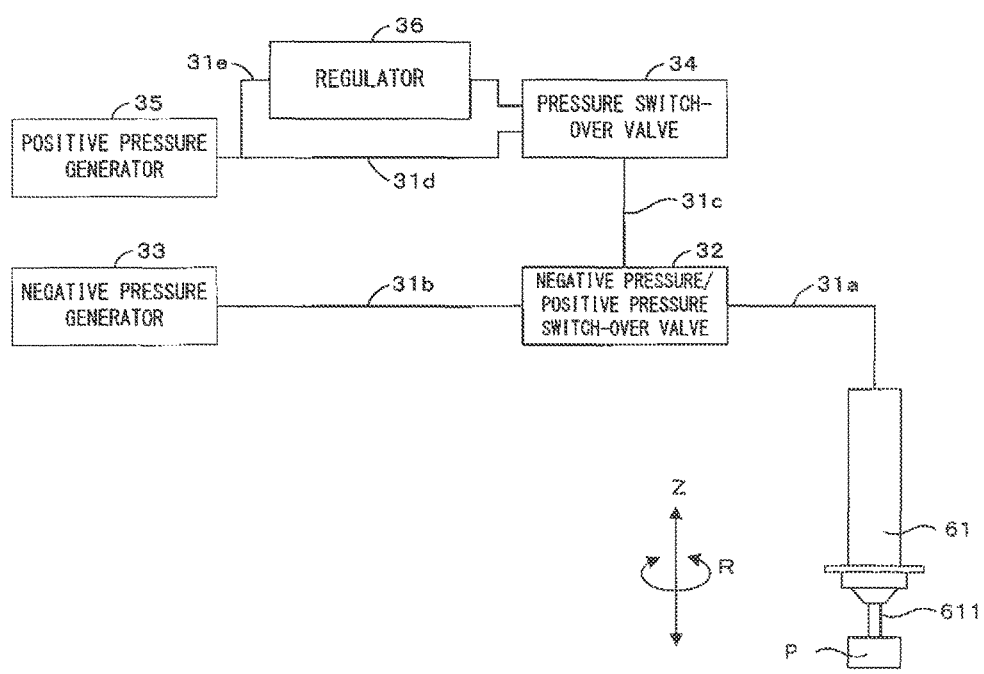
FIG. 3 is a partial side view showing an area near a nozzle of a mount head which the surface mount machine shown in FIG. 1 comprises.
Figure 4:
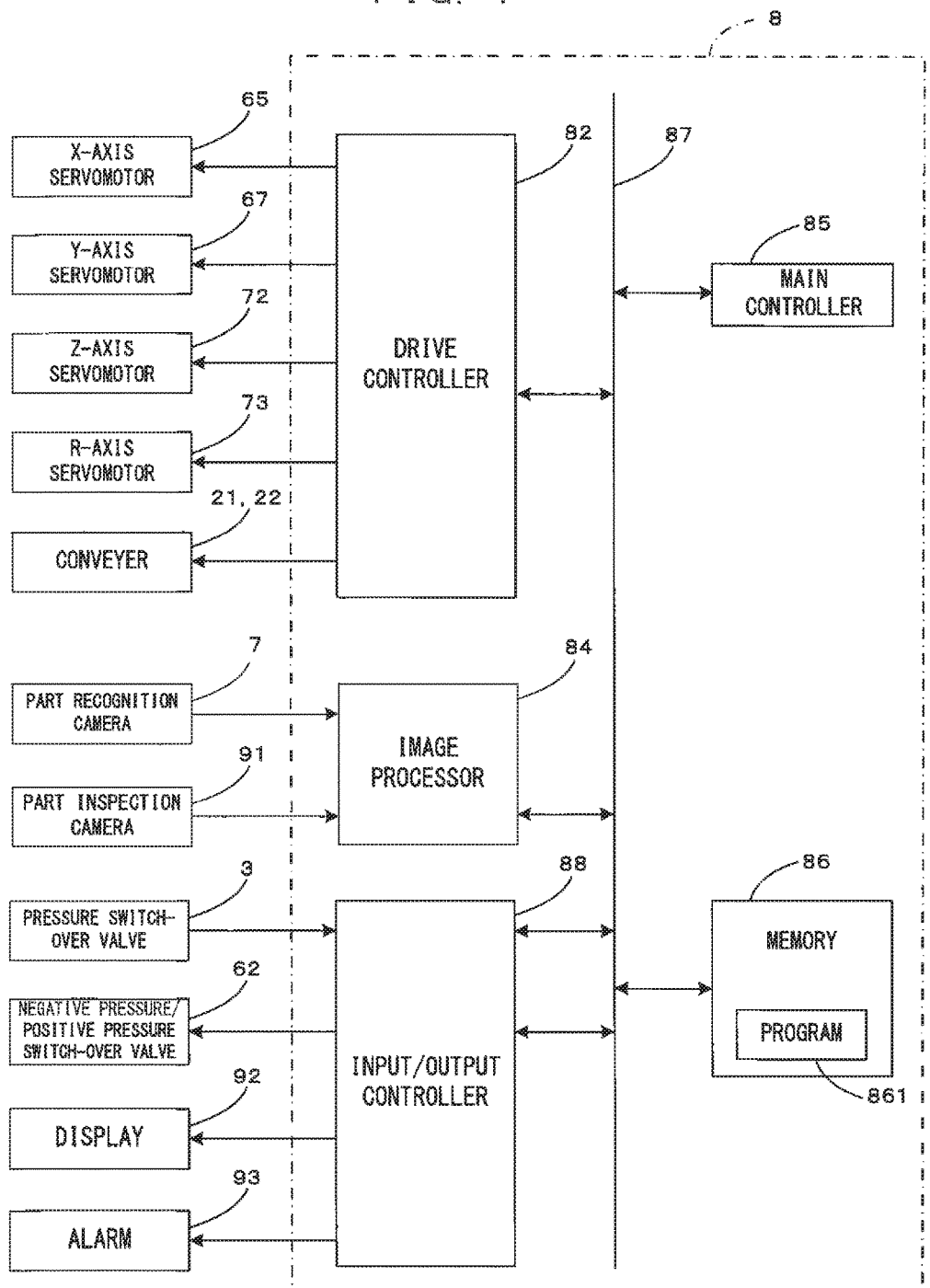
FIG. 4 is a block diagram which shows a main electric structure of the surface mount machine shown in FIG. 1.

FIG. 1 is a plan view showing a schematic structure of a surface mount machine which is equipped with a pressure control device according to an embodiment of the disclosure. FIG. 2 is a partial front view of the surface mount machine shown in FIG. 1. FIG. 3 is a partial side view showing an area near a nozzle of a mount head which the surface mount machine shown in FIG. 1 comprises. Further, FIG. 4 is a block diagram which shows a main electric structure of the surface mount machine shown in FIG. 1. In FIGS. 1 through 3, for clarity of the relationship among the directions in each drawing, the XYZ rectangular coordinates axes are shown.

In this surface mount machine 1, a substrate transportation mechanism 2 is disposed on a base 11 so that it is possible to transport a substrate S in a predetermined transportation direction X. Describing more specifically, the substrate transportation mechanism 2 comprises paired conveyers 21, 21 which transport the substrate S from the right-hand side toward the left-hand side in FIG. 1 on the base 11. As the conveyers 21, 21 operate in accordance with an operation command from a drive controller 82 of a controller unit 8, the substrate S is loaded, stopped at a predetermined mount operating location (which is the location of the substrate S shown in FIG. 1), and then fixed and held by a holding device which is not shown in the drawing. An electronic part P supplied from a part supplier 4 is transferred by a mount head 61 of a head unit 6 onto the substrate S. After all parts P to be mounted to the substrate S are mounted to the substrate S, the substrate transportation mechanism 2 unloads the substrate S. There is a part recognition camera 7 disposed on the base 11. The part recognition camera 7 is formed by an illumination part, a CCD (Charge Coupled Device) camera and the like, and captures the images of the parts P sucked and held by suction nozzles 611 of the mount heads 61 of the head unit 6 from below. It is therefore possible to inspect how the parts P are sucked by the suction nozzles 611 based upon thus captured images.

Part suppliers 4 are disposed on the forward side (the +Y-axis direction side) and on the rear side (the −Y-axis direction side) of the substrate transportation mechanism 2 which has the structure above. The part suppliers 4 comprise a large number of tape feeders 41. Each tape feeder 41 comprises a reel (not shown) around which a tape housing and holding parts P is wound so that it is possible to supply parts P to the head unit 6. That is, in each tape, at predetermined intervals, piece-like chip parts P such as integrated circuits (IC), transistors and capacitors are housed and held. As the tape feeder 41 feeds the tape from the reel toward the head unit 6, parts P in the tape intermittently are reeled out to the part sucking positions, thereby making it possible to pick up parts P by the suction nozzles 611 which are mounted to the mount heads 61 of the head unit 6.

The head unit 6 transports parts P to the substrate S while sucking and holding the parts P by the suction nozzles 611 of the mount heads 61, and transfers to part mount positions instructed by a user. It further comprises twelve mount heads 61 in total, namely, six mount heads 61F which are arranged like a row on the front side along the X-axis direction and six mount heads 61R which are arranged like a row on the rear side along the X-axis direction. That is, as shown in FIGS. 1 and 2, in the head unit 6, the six mount heads 61F, which extend in the vertical direction Z, are disposed like a row at an equal pitch along the X-axis direction (which is the transportation direction in which the substrate transportation mechanism 2 transports the substrate S). On the rear side (the −Y-axis direction side) to the mount heads 61F as well, a rear row which has a similar structure to that of the front row is disposed. In this embodiment, the mount heads 61F and the mount heads 61R are so arranged that they are shifted by half the pitch from each other in the X-axis direction, thereby forming a zigzag arrangement in a planar view as shown in FIG. 1. Hence, when viewed from the Y-axis direction, the twelve mount heads 61 are lined up in a row along the X-axis direction without overlapping each other as shown in FIG. 2.

A switch-over valve described below is disposed to each mount head 61 so that it is possible to supply a positive pressure and a negative pressure to the respective suction nozzles 611. In other words, as shown in FIG. 3, the suction nozzle 611 fitted to the tip end of each mount head 61 is connected by a pipe 31a to a negative pressure/positive pressure switch-over valve 32. In addition to the pipe 31a above, pipes 31b and 31c are connected to the negative pressure/positive pressure switch-over valve 32. Of these, the pipe 31b is connected to a negative pressure generator 33 which is formed by a vacuum pump and the like. Hence, while a switch-over signal fed from the controller unit 8 to the negative pressure/positive pressure switch-over valve 32 is set to a "negative pressure" level, the negative pressure/positive pressure switch-over valve 32 connects the pipe 31a only to the pipe 31b. A negative pressure is consequently supplied to the suction nozzle 611 via a negative pressure supply route which is formed by the pipe 31a, the negative pressure/positive pressure switch-over valve 32 and the pipe 31b. Meanwhile, as the switch-over signal above changes to a "positive pressure" level, the negative pressure/positive pressure switch-over valve 32 changes connection of the pipe 31a to the pipe 31c from the pipe 31b.

The pipe 31c is connected to a pressure switch-over valve 34. In addition to the pipe 31c, pipes 31d and 31e as well are connected to the pressure switch-over valve 34. Of these, the pipe 31d is connected to a positive pressure generator 35 which is formed by a compressor and the like and functions as a supply pathway for supplying compressed air which has a relatively high pressure generated by the positive pressure generator 35, namely, a "first positive pressure supply pathway." In this embodiment, the compressed air is set to a "first positive pressure" which is appropriate for cleaning of the suction nozzle 611 as described later.

The other pipe 31e is a branch line branching from the pipe 31d, and at its center, a regulator 36 is inserted. The regulator 36 is equipped with a function of reducing the pressure of compressed air flowing via the pipes 31d and 31e down to a "second positive pressure" which is appropriate to a part mounting process which will be described later. Air regulated to the lower pressure (the second positive pressure) by the regulator 36 is then fed toward the pressure switch-over valve 34 by the pipe 31e. In this fashion, the pipe 31e functions as a "second positive pressure supply pathway" of the disclosure.

In accordance with the switch-over signal from the controller unit 8, the pressure switch-over valve 34 switches between connection of the pipe 31c to the pipe 31d and connection of the pipe 31c to the pipe 31e. Describing more specifically, while the switch-over signal is at a "high pressure" level, the pressure switch-over valve 34 switches over to the condition that the pipe 31d is connected to the pipe 31c, namely, a "first connected state." On the other hand, as the switch-over signal changes to a "low pressure" level, the pressure switch-over valve 34 switches connection of the pipe 31c from the pipe 31d to the pipe 31e, that is, switches over to a "second connected state" that the pipe 31e is connected to the pipe 31c. Therefore, while the negative pressure/positive pressure switch-over valve 32 remains switched over to the positive pressure supply side, a positive pressure is supplied to the suction nozzle 611 via the pipe 31*c*, the negative pressure/positive pressure switch-over valve 32 and the pipe 31*a*. Further, as described later, it is possible to adjust the pressure of air supplied to the suction nozzle 611 due to switching of the connected state by the pressure switch-over valve 34 as desired within the range from the first positive pressure to the second positive pressure. In this embodiment, the supply line which is formed by the pipe 31*c*, the negative pressure/positive pressure switch-over valve 32 and the pipe 31*a* corresponds to an example of a "nozzle connecting pathway" of the disclosure.

The switch-over signals to the negative pressure/positive pressure switch-over valve 32 and the pressure switch-over valve 34 are generated by a main controller 85 of the controller unit 8 according to a program which is stored in a memory part 86. Through switching by the negative pressure/positive pressure switch-over valve 32 and the pressure switch-over valve 34, a part sucking process, the part mounting process (FIG. 5), the nozzle cleaning process (FIG. 6), a nozzle exchanging process (FIG. 6), a part cleaning process (FIG. 7), a substrate cleaning process (FIG. 7), a part discarding process (FIGS. 7 and 8) and the like are executed. These processes will be described in detail later with reference to FIGS. 5 through 8. In this embodiment, the main controller 85 functions as a "valve controller" of the disclosure, while the pipes 31*a* and 31*c* through 31*e*, the negative pressure/positive pressure switch-over valve 32, the pressure switch-over valve 34 and the main controller 85 form the "pressure control device" of the disclosure.

Each mount head 61 is capable of moving up and down (movement along the Z-axis direction) relative to the head unit 6 by a nozzle up/down movement drive mechanism not shown, and is capable of rotating about the central axis of the nozzle (rotation in the R-direction in FIGS. 2 and 3) by a nozzle rotation drive mechanism not shown. Of these drive mechanisms, the nozzle up/down movement drive mechanism moves up and down the mount head 61 between a bottom position (bottom end) for performing suction or mounting and an up position (top end) for carrying out transportation. Meanwhile, the nozzle rotation drive mechanism is a mechanism for rotating the suction nozzle 611 as needed, and can position a part P in a predetermined R-axis direction during mounting by rotation driving. Each one of the drive mechanisms is formed by a Z-axis servo motor 72, an R-axis servo motor 73 and a predetermined power transmission mechanism, and as a drive controller 82 of the controller unit 8 controls driving of the Z-axis servo motor 72 and the R-axis servo motor 73, each mount head 61 is made to move in the Z-direction and the R-direction.

For the purpose of transporting parts P sucked by the mount heads 61 between the part suppliers 4 and the substrate S and mounting them on the substrate S, the head unit 6 can move along the X-axis direction and the Y-axis direction (the X-axis direction and the direction which is orthogonal to the Z-axis direction) over a predetermined range on the base 11. That is, the head unit 6 is supported so as to move along the X-axis relative to a mount head support member 63 which extends in the X-axis direction. The mount head support member 63 is supported at its both ends by a fixed rail 64 which is along the Y-axis direction, and is capable of moving in the Y-axis direction along the fixed rail 64. The head unit 6 is driven in the X-axis direction by the X-axis servo motor 65 via a ball screw 66, the mount head support member 63 is driven in the Y-axis direction by the Y-axis servo motor 67 via a ball screw 68. The head unit 6 is thus capable of transporting parts P sucked by the suction heads 61 to target positions from the part suppliers 4.

Further, the head unit 6 comprises a part inspection camera 91. The part inspection camera 91 is formed by an illumination part, a CCD camera and the like, and is used for inspecting the mounted conditions of electronic parts mounted to the substrate S. Describing specifically, as the drive controller 82 appropriately moves the head unit 6, the part inspection camera 91 moves to above the mount positions of the parts P. In this state, the images of the parts P captured by the part inspection camera 91 are transferred to an image processor 84.

The surface mount machine 1 comprises a display 92 and an alarm 93 which function as an interface with an operator. The display 92 has a function of displaying the operating state of the surface mount machine 1 and a function as an input terminal which is formed by a touch panel and receives entries by the operator. In the meantime, the alarm 93 signals to the operator an error (abnormality) occurring in the surface mount machine 1, and is formed by an emergency lamp which alarms by light, an emergency buzzer which alarms by a buzzer sound or the combination of the two. An input/output controller 88 of the controller unit 8 controls inputs to and outputs from the display 92 and the alarm 93.

Figure 5:
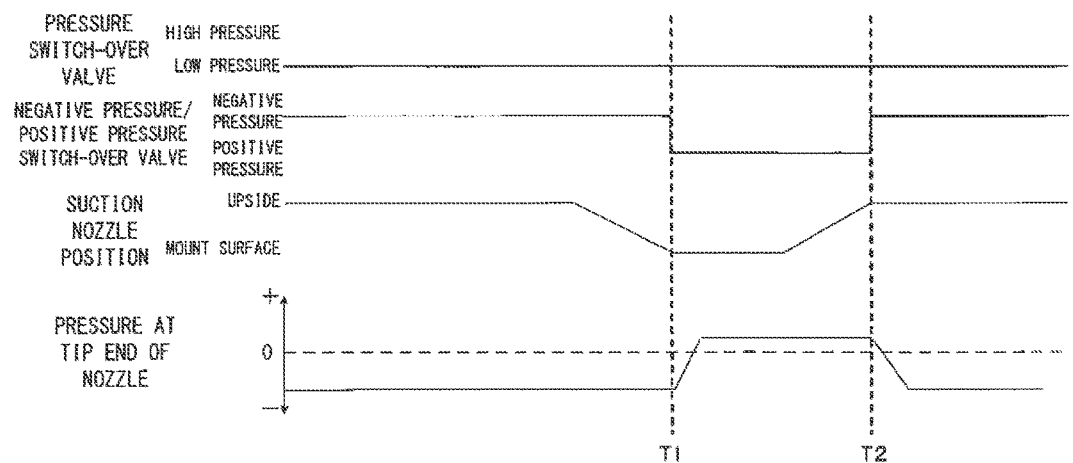
FIG. 5 is a timing chart which shows operations of the respective portions of a machine during the part mounting process.

Next, operations of the surface mount machine 1 which has the structure above will be described with reference to FIGS. 5 through 8. In FIG. 5, "SUCTION NOZZLE POSITION" is indicative of the positions of the tip ends of the suction nozzles 611, and "MOUNT SURFACE" is indicative of the nozzle tip end positions as they are when the suction nozzles 611 are set to the position of the height which is appropriate for mounting of a part sucked by the suction nozzle 611. In FIGS. 5 through 8, "PRESSURE SWITCH-OVER VALVE" and "NEGATIVE PRESSURE/POSITIVE PRESSURE SWITCH-OVER VALVE" are indicative of the levels of the switch-over signals which are fed respectively to the pressure switch-over valve 34 and the negative pressure/positive pressure switch-over valve 32. Further, in FIGS. 5 through 8, "PRESSURE AT TIP END OF NOZZLE" is indicative of the pressure at the tip ends of the suction nozzles 611.

The surface mount machine 1 is controlled comprehensively by the main controller 85. In other words, the main controller 85 sends signals to and receives signals from with the respective portions of the controller unit 8 via a bus 87 based upon a program, data and the like stored in the memory 86 and accordingly controls the surface mount machine 1 as a whole. That is, the main controller 85 reads a program for manufacturing 861 (manufacturing program) which is stored in the memory part 86. As the main controller 85 controls the respective portions of the surface mount machine 1 in accordance with the program 861, a basic operation described below is repeated, whereby parts are mounted to the substrate S.

Movement to Suction Point

The head unit 6 moves to above the tape feeders 41 which contain parts P to be mounted next.

Suction of Parts

The mount heads 61 are moved down toward parts P in the Z-axis direction, thereby making the suction nozzles 611 abut on parts P. The switch-over signal to be fed to the negative pressure/positive pressure switch-over valve 32 is switched over to the "negative pressure" level, the negative pressure is supplied to the suction nozzles 611, and parts P are sucked and held. The mount heads 61 sucking and holding parts P are then moved upward in the Z-axis direction. As shown in FIG. 5, the switch-over signal is maintained at the "negative pressure" level until parts P have moved to the mount surface of the substrate S so that supplying of the negative pressure to the suction nozzles 611 is continued. Further, the switch-over signal to be fed to the switch-over valve 34 is switched over to the "low pressure" level, which completes preparation for supplying of "the second positive pressure" which is appropriate for mounting of parts.

Recognition of Parts

The head unit 6 moves to a position above the part recognition camera 7. The part recognition camera 7 captures the images of parts P which are sucked and held by the suction nozzles 611, and whether the parts P are good or defective, including the suction conditions, is confirmed.

Mounting of Parts

After confirming that the parts P are good parts, the head unit 6 moves to a position above the part mount position which is for mounting the part P. The mount head 61 is then moved down in the Z-axis direction, and the part sucked and held by the mount head 61 is moved to a mount point. As shown in FIG. 5, the switch-over signal to be fed to the negative pressure/positive pressure switch-over valve 32 is switched over to the "positive pressure" level upon arrival at the mount point (timing T1). This releases the part P from suction and holding by the suction nozzle 611, and air is supplied to the suction nozzles 611 at "the second positive pressure." As a result, as shown in this drawing, the pressure at the tip end of the suction nozzle 611 starts to gradually rise at the timing T1, and at timing T2, air is ejected to the top surfaces of the part P at "the second positive pressure." The air ejection instantaneously moves the part P away from the suction nozzle 611 and mounts it to the substrate S. Following this, the mount head 61 which has finished mounting the part is moved up in the Z-axis direction, and the switch-over signal to be fed to the negative pressure/positive pressure switch-over valve 32 is switched over to the "negative pressure" level (timing T3).

Figure 6:
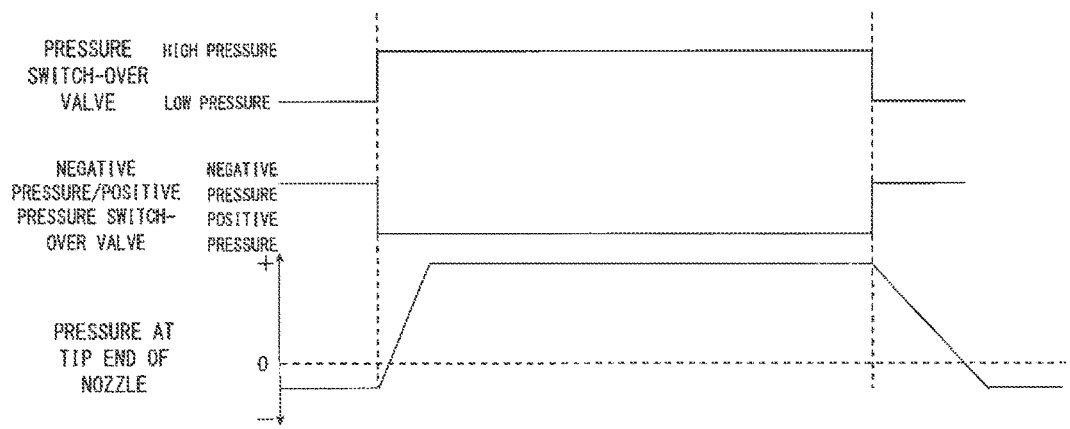
FIG. 6 is a timing chart which shows operations of the respective portions of a machine during the nozzle cleaning process and nozzle exchanging process.

By the way, dust, foreign matters or the like may adhere to the tip ends of the suction nozzles 611 while the basic operation above is repeated, making it necessary to clean the suction nozzles 611 at proper times. Further, it may become necessary to exchange the suction nozzles 611 at a timing that type of parts P to be mounted is changed. On these occasions, while supplying a relatively high pressure to the suction nozzles 611, the nozzle cleaning process or the nozzle exchange process is executed. Noting this, in this embodiment, during the nozzle cleaning process or the nozzle exchange process, the switch-over signals to be supplied to the negative pressure/positive pressure switch-over valve 32 and the pressure switch-over valve 34 are switched over respectively to the "positive pressure" level and the "high pressure" level, and the "first positive pressure" is supplied to the suction nozzles 611 as shown in FIG. 6. This realizes air ejection at a high pressure from the suction nozzles 611, and hence, the nozzle cleaning process and the nozzle exchange process are executed fast and reliably. After completion of the nozzle cleaning process or the nozzle exchange process, the switch-over signals to be supplied to the negative pressure/positive pressure switch-over valve 32 and the pressure switch-over valve 34 are switched over respectively to the "negative pressure" level and the "low pressure" level, and a negative pressure is supplied to the suction nozzles 611.

Further, as in the disclosure described in the Japanese Patent Application No. 2011-71291 (FIG. 5), the surface mount machine 1 is capable of cleaning a pre-suction part P, namely, executing what is called the part cleaning process, and therefore, selectively carrying out the part cleaning process as designated by a user. Of course, the part cleaning process may be carried out for every suction of parts. What to note here however is the pressure of air which is used for the part cleaning process. In other words, if air which has the "first positive pressure" used for the nozzle cleaning process and the nozzle exchange process is ejected to a part P, the part P may be blown away. On the other hand, if air which has the "second positive pressure" used for the part mounting process is ejected to a part P, sufficient effect of cleaning a part may not be realized. In this embodiment therefore, air having a pressure which is between the "first positive pressure" and the "second positive pressure," namely an intermediate pressure is supplied to the suction nozzles 611 and air having the intermediate pressure which is suitable to the part cleaning process is ejected. The part cleaning process according to this embodiment will now be described with reference to FIG. 7.

Figure 7:
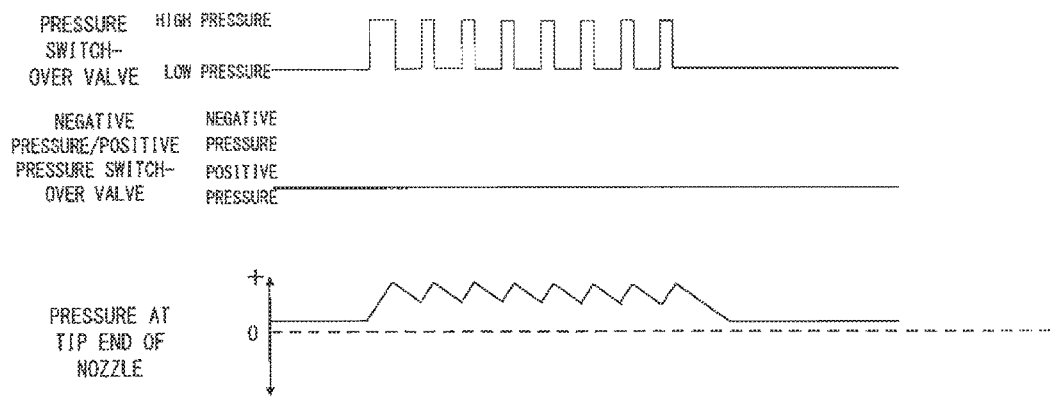
FIG. 7 is a timing chart which shows operations of the respective portions of the machine during the part cleaning process.
Figure 8:
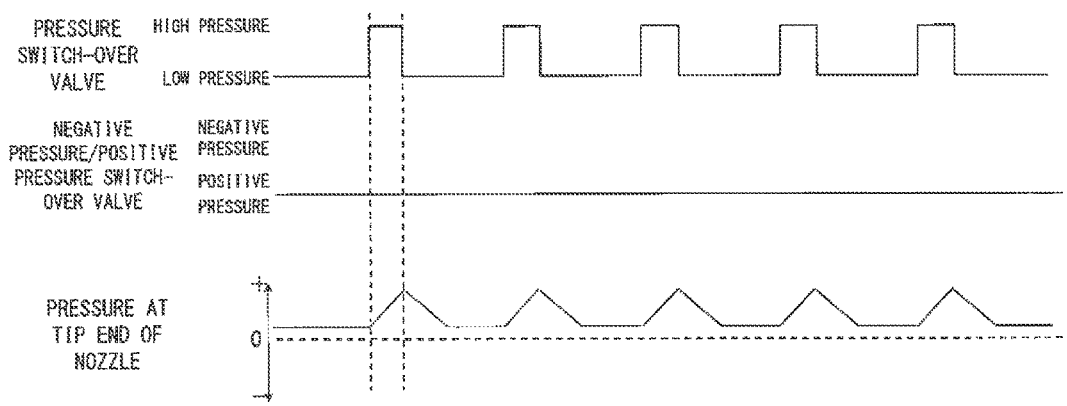
FIG. 8 is a timing chart which shows operations of the respective portions of the machine during the part discarding process.

FIG. 7 is a timing chart which shows operations of the respective portions of the machine during the part cleaning process. Before abutting the suction nozzle 611 on the part P and sucking the part, as shown in FIG. 7, the switch-over signal to be supplied to the negative pressure/positive pressure switch-over valve 32 is switched over to the "positive pressure" level, and the "second positive pressure" is supplied to the suction nozzle 611. At this point, the pressure of air supplied to the part P from the suction nozzles 611 is suppressed to the same value as that for the phase of mounting the part. Upon completion of switching to the positive pressure, the switch-over signal to be supplied to the pressure switch-over valve 34 is alternately switched between the "high pressure" level and the "low pressure" level multiple times. This realizes alternation of supplying of air at the "first positive pressure" to the suction nozzles 611 and supplying of air at the "second positive pressure" to the suction nozzles 611. While the pressure applied to the tip end of the suction nozzles 611 changes as a result of this like a pulsating flow between the "first positive pressure" and the "second positive pressure," the median pressure is the intermediate pressure which is lower than the first positive pressure but is higher than the second positive pressure. In the case as that shown in FIG. 7 where the cycle of switching the level is set to be relatively short, the amplitude of pressure variations about the median pressure which is the intermediate pressure is relatively narrow, and the pressure at which air supplied to the part P from the suction nozzles 611 is ejected is substantially stable at the intermediate pressure. It is therefore possible to effectively remove dust, foreign matters and the like adhering to the parts P without blowing away the parts P.

It is possible to adjust the value of the intermediate pressure by controlling the rate of the period during which the switch-over signal to be supplied to the pressure switch-over valve 34 is maintained at the "high pressure" level and a "first connected state" is achieved to the period during which the switch-over signal to be supplied to the pressure switch-over valve 34 is maintained at the "low pressure" level and a "second connected state" is achieved. The rate above may be controlled in accordance with the type of parts P. For example, in case of relatively large parts P, the proportion of the period during which the "first connected state" is achieved may be increased and the intermediate pressure may accordingly be made closer to the "first positive pressure." In contrast, in case of relatively small parts P, the proportion of the period during which the "second connected state" is achieved may be increased and the intermediate pressure may accordingly be made closer to the "second positive pressure." It is thus possible to perform the part cleaning process using air which is at an appropriate pressure for each part P.

Further, dust, foreign matters or the like may adhere to the part mount surface of the substrate S. In this embodiment therefore, it is possible to clean the substrate using air ejected from the suction nozzles 611 and selectively perform the substrate cleaning process as designated by a user. However, what to note here is again the value of the positive pressure of air. This is because a solder is printed on the substrate S as it is prior to mounting parts. If air which has the "first positive pressure" used for the nozzle cleaning process and the nozzle exchange process is ejected to the substrate S, print patterns of the solder may be adversely affected. On the other hand, if air which has the "second positive pressure" used for the part mounting process is ejected to the substrate S, a sufficient effect of cleaning the substrate may not be realized. In this embodiment therefore, as in the part cleaning process, the switch-over signal to be supplied to the pressure switch-over valve 34 is alternately switched between the "high pressure" level and the "low pressure" level multiple times and air which has the intermediate pressure is ejected from the suction nozzles 611 as shown in FIG. 7. This ensures that the pressure at which air is supplied to the substrate S from the suction nozzles 611 is stable at the intermediate pressure, and hence, attains effective removal of dust, foreign matters and the like adhering to the substrate S without negatively affecting the print patterns. As print patterns of a solder formed on the substrate S may be different between different substrates, as in the part cleaning process, the rate above may be controlled in accordance with the type of the substrate S. It is thus possible to execute the substrate cleaning process using air which has a proper pressure for each substrate S.

Further, in this embodiment, in the event that a part P sucked by a suction nozzle 611 is a defective part, the head unit 6 moves to above a discarding portion (not shown) for defective parts. After supplying of the negative pressure to the suction nozzle 611 is discontinued, the positive pressure is supplied to the suction nozzle 611 and the defective part is discarded in the discarding portion. At this time as well, it is ideal to adjust the pressure of air ejected from the suction nozzle 611 to the intermediate pressure as in the part cleaning process and the substrate cleaning process. In this embodiment therefore, the switch-over signal to be supplied to the pressure switch-over valve 34 is alternately switched between the "high pressure" level and the "low pressure" level multiple times and air which has the intermediate pressure is ejected from the suction nozzle 611 as shown in FIG. 7. This ensures that the pressure at which air is supplied to the substrate S from the suction nozzle 611 is stable at the intermediate pressure, and hence, attains reliable discarding of a defective part P from the suction nozzle 611 into the discarding portion.

Adherence of the part P to the suction nozzle 611 may become different depending upon the weight and the nature of the surface (the viscosity, the hardness, etc.) of the part. Hence, the main controller 85 may control the rate above in accordance with the type of a defective part P. When a part P which can easily adhere to the suction nozzle 611 needs be discarded, the proportion of the period during which the "first connected state" is attained may be increased and the intermediate pressure may accordingly be made closer to the "first positive pressure." In contrast, when a part P which cannot easily adhere to the suction nozzle 611 needs be discarded, the proportion of the period during which the "second connected state" is attained may be increased and the intermediate pressure may accordingly be made closer to the "second positive pressure." Adjusting the intermediate pressure for each part P in the manner described above makes it possible to smoothly carry out the part discarding process.

Further, for discarding a part P, to vary the pressure at the tip end of the nozzle like a pulse may be more preferable than to continuously blow to the part P the intermediate pressure which is approximately constant while reducing the amplitude of pressure variations narrow as described above. In this embodiment therefore, the cycle of switching the level of the switch-over signal may be set to be relatively long as show in FIG. 8 for instance by controlling the rate above, and air may be ejected in a pressure waveform which is for example continuous canine teeth or pulse-like triangular waveform. In this manner, when the pressure at the tip end of the nozzle varies it is possible to more easily separate close adherence of the defective part P with the suction nozzle 611, and to achieve effective discarding of the part.

As described above, according to the embodiment, the nozzle cleaning process and the nozzle exchange process are performed while air which has the high pressure (the first positive pressure) generated by the positive pressure generator 35 is supplied as it is to the suction nozzle 611 via the pipe 31d, the pressure switch-over valve 34, the pipe 31c, the negative pressure/positive pressure switch-over valve 32 and the pipe 31a (high pressure mode). The part mounting process is performed while air which is regulated by the regulator 36 to the low pressure (the second positive pressure) is supplied as it is to the suction nozzles 611 via the pipe 31e, the pressure switch-over valve 34, the pipe 31c, the negative pressure/positive pressure switch-over valve 32 and the pipe 31a (low pressure mode). Further, air which has the two types of pressures described above is alternately supplied to the suction nozzle 611 by the pressure switch-over valve 34, and the pressure at the tip end of the nozzle accordingly becomes the intermediate pressure (intermediate pressure mode). The control of the only connected state of the pressure switch-over valve 34 realizes stable control of the pressure of air which is supplied to the suction nozzles 611 over a wide range from the high pressure (the first positive pressure) to the low pressure (the second positive pressure). In addition, it is possible to provide, at a low cost, a pressure control device which is capable of achieving pressure control over such a wide range using a small number of structure components, which greatly contributes to reduction of the machine cost of the surface mount machine 1.

In the high pressure mode, the pressure switch-over valve 34 remains in the state (the first connected state) in which the pipes 31d and 31c are connected and air of the first positive pressure is supplied to the suction nozzle 611, and it is possible to carry out the nozzle cleaning process and the nozzle exchange process while the high pressure is maintained. This makes it possible to perform the nozzle cleaning process and the nozzle exchange process at a high efficiency.

Meanwhile, in the low pressure mode, the pressure switch-over valve 34 remains in the state (the second connected state) in which the pipes 31e and 31c are connected and air of the second positive pressure is supplied to the suction nozzle 611, and therefore, it is possible to suppress variations of the pressure of the air which is supplied to the suction nozzle 611 during the part mounting process and makes the part mounting process highly precise.

Moreover, in the intermediate pressure mode, as the two types of connected states described above are switched over with each other multiple times, air is supplied at any desired positive pressure (third positive pressure) which is lower than the first positive pressure but is higher than the second positive pressure, and therefore, it is possible to carry out each one of the part cleaning process, the substrate cleaning process and the part discarding process at a proper pressure.

Thus, in this embodiment, the surface mount machine 1 corresponds to an example of a "processing machine" of the disclosure, and a part P corresponds to an example of a "member-to-be-processed" of the disclosure. Further, the pressure switch-over valve 34 corresponds to an example of a "switch-over valve" of the disclosure. The regulator 36 corresponds to an example of a "pressure adjustor" of the disclosure.

The disclosure is not limited to the embodiment described above but may be modified in various manners in addition to the embodiment above, to the extent not deviating from the object of the disclosure. For instance, although the embodiment above requires that the rate of the duration of the first connected state to the duration of the second connected state is maintained approximately constant during the part cleaning process, the substrate cleaning process and the part discarding process, the rate above may be changed. Changing the rate makes it possible to vary the value of the third positive pressure.

Further, while the embodiment above is directed to application of the pressure control device according to the disclosure to the surface mount machine 1, the disclosure is not applicable only to this but may be applied generally to any processing machine which ejects a gas from a nozzle to a member-to-be-processed and performs predetermined processing of the member-to-be-processed. The gas is not limited to air, application to a processing machine in which other gas than air is ejected from the nozzle is also possible. Of course, the processing machine above includes an inspection machine, a printing machine and the like which are used in a system for mounting parts to a substrate. In case of a printing machine for example, a mask which is used to print a solder paste on a substrate is the "member-to-be-processed" of the disclosure, air is ejected from the nozzle toward the mask, and the solder material remaining at opening patterns of the mask is removed and cleaned. With respect to such a printing machine as well, application of the pressure control device of the disclosure makes it possible to perform the mask cleaning process well while providing the nozzle with air which has an appropriate pressure to the mask cleaning process to the nozzle.

Moreover, although the surface mount machine 1 comprises the negative pressure generator 33 as a negative pressure source and the positive pressure generator 35 as a positive pressure source in the embodiment above, a negative pressure generator and a positive pressure generator which are disposed outside the surface mount machine 1 may be used instead. For example, when a negative pressure generator and a positive pressure generator which are appropriate are made available in a factory where the surface mount machine 1 is installed for instance, these may be used.

INDUSTRIAL APPLICABILITY

The disclosure may be applied to any pressure control technique in general of controlling the pressure of a gas supplied to a nozzle in a processing machine which ejects the gas from the nozzle toward a member-to-be-processed and performs predetermined processing of the member-to-be-processed and to a surface mount machine which uses such a pressure control technique.

What is claimed is:

1. A surface mount machine that ejects a gas from a nozzle to a part after stopping the supplying of a negative pressure to the nozzle sucking the part and mounts the part from a nozzle to a substrate, comprising:
   a first positive pressure supply pathway to supply the gas at a first positive pressure;
   a second positive pressure supply pathway to supply the gas at a second positive pressure that is lower than the first positive pressure;
   a nozzle connecting pathway that is connected to the nozzle;
   a switch-over valve that selectively switches between a first connected state in which the first positive pressure supply pathway is connected to the nozzle connecting pathway and a second connected state in which the second positive pressure supply pathway is connected to the nozzle connecting pathway; and
   a valve controller that controls the connected state of the switch-over valve,
   wherein the valve controller executes:
   a high pressure mode in which the first connected state is continued and the gas is supplied to the nozzle at the first positive pressure when cleaning the nozzle that does not suck the part;
   a low pressure mode in which the second connected state is continued after stopping supplying of the negative pressure to the nozzle and the gas is supplied to the nozzle at the second positive pressure when mounting the part to the substrate from the nozzle; and
   an intermediate pressure mode in which the connected state of the switch-over valve is switched multiple times after stopping supplying of the negative pressure to the nozzle, and the gas is supplied to the nozzle at the third positive pressure that is lower than the first positive pressure and is higher than the second positive pressure to remove the defective part from the nozzle when the part sucked by the nozzle is a defective part.

2. The surface mount machine of claim 1, wherein in the intermediate pressure mode, the valve controller controls the rate of the duration of the first connected state to the duration of the second connected state in accordance with the type of the part sucked by the nozzle and changes the value of the third positive pressure.

3. The surface mount machine of claim 1, wherein in the intermediate pressure mode, the valve controller controls the rate of the duration of the first connected state to the duration of the second connected state and continuously changes the pressure of the gas supplied to the nozzle like a pulse.

4. A surface mount machine that ejects a gas from a nozzle to a part after stopping the supplying of a negative pressure to the nozzle sucking the part and mounts the part from a nozzle to a substrate, comprising:
   a first positive pressure supply pathway to supply the gas at a first positive pressure;
   a second positive pressure supply pathway to supply the gas at a second positive pressure that is lower than the first positive pressure;
   a nozzle connecting pathway that is connected to the nozzle;
   a switch-over valve that selectively switches between a first connected state in which the first positive pressure supply pathway is connected to the nozzle connecting pathway and a second connected state in which the second positive pressure supply pathway is connected to the nozzle connecting pathway; and
   a valve controller that controls the connected state of the switch-over valve, wherein the valve controller executes:
a high pressure mode in which the first connected state is continued and the gas is supplied to the nozzle at the first positive pressure when cleaning of the nozzle that does not suck the part;
a low pressure mode in which the second connected state is continued after stopping supplying of the negative pressure to the nozzle, and the gas is supplied to the nozzle at the second positive pressure when mounting the part to the substrate from the nozzle; and
an intermediate pressure mode in which the connected state of the switch-over valve is switched multiple times and the gas is supplied to the nozzle at a third positive pressure that is lower than the first positive pressure and is higher than the second positive pressure when cleaning a part yet to be mounted to the substrate or cleaning the substrate using the gas.

5. The surface mount machine of claim 4, wherein the valve controller changes the rate of the duration of the first connected state to the duration of the second connected state in accordance with the type of the part and changes the value of the third positive pressure when cleaning a part not yet sucked to the nozzle by execution of the intermediate pressure mode.

6. The surface mount machine of claim 4, wherein the valve controller changes the rate of the duration of the first connected state to the duration of the second connected state in accordance with the type of a solder or the nature of printing and changes the value of the third positive pressure when cleaning the substrate on which the solder has been printed by execution of the intermediate pressure mode.

7. A pressure control method to control a pressure of a gas that is supplied to a nozzle in a processing machine that performs predetermined processing upon a member-to-be-processed while ejecting the gas from the nozzle toward the member-to-be-processed, the method comprising steps of:
preparing the gas that has the first positive pressure;
preparing the gas that has the second positive pressure lower than the first positive pressure; and
controlling selective switching of supplying of the gas to the nozzle at the first positive pressure and supplying of the gas to the nozzle at the second positive pressure, and controlling the pressure of the gas supplied to the nozzle within the range from the first positive pressure to the second positive pressure.

* * * * *